United States Patent
Bassett et al.

(10) Patent No.: US 10,515,820 B2
(45) Date of Patent: Dec. 24, 2019

(54) PROCESS AND APPARATUS FOR PROCESSING A NITRIDE STRUCTURE WITHOUT SILICA DEPOSITION

(71) Applicant: Tokyo Electron Limited, Minato-ku, Tokyo (JP)

(72) Inventors: Derek Bassett, Cedar Park, TX (US); Wallace P. Printz, Austin, TX (US); Antonio L. P. Rotondaro, Austin, TX (US); Teruomi Minami, Kurume (JP); Takahiro Furukawa, Kurume (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/467,973

(22) Filed: Mar. 23, 2017

(65) Prior Publication Data
US 2017/0287726 A1    Oct. 5, 2017

Related U.S. Application Data (60) Provisional application No. 62/315,632, filed on Mar. 30, 2016, provisional application No. 62/315,559, filed on Mar. 30, 2016.

(51) Int. Cl.
*H01L 21/311* (2006.01)
*H01L 21/02* (2006.01)
(Continued)

(52) U.S. Cl.
CPC .... *H01L 21/31111* (2013.01); *H01L 21/0214* (2013.01); *H01L 21/02052* (2013.01);
(Continued)

(58) Field of Classification Search
None
See application file for complete search history.

(56) References Cited

U.S. PATENT DOCUMENTS 4,116,714 A * 9/1978 Basi ................ C23G 1/00
134/28
5,885,903 A * 3/1999 Torek ............ H01L 21/31111
216/99
(Continued)

FOREIGN PATENT DOCUMENTS

JP    H06-349808 A    12/1994
JP    2014099480 A    5/2014
(Continued)

OTHER PUBLICATIONS

Mavredaki et al., "Inhibition And Dissolution as Dual Mitigation Approaches For Colloidal Silica Fouling And Deposition In Process Water Systems: Functional Synergies", Ind. Eng. Chem. Res., 2005, 8 pgs.
(Continued)

*Primary Examiner* — Stephanie P Duclair
(74) *Attorney, Agent, or Firm* — Wood Herron & Evans LLP (57) ABSTRACT

Techniques are provided to remove the growth of colloidal silica deposits on surfaces of high aspect ratio structures during silicon nitride etch steps. A high selectivity overetch step is used to remove the deposited colloidal silica. The disclosed techniques include the use of phosphoric acid to remove silicon nitride from structures having silicon nitride formed in narrow gap or trench structures having high aspect ratios in which formation of colloidal silica deposits on a surface of the narrow gap or trench through a hydrolysis reaction occurs. A second etch step is used in which the hydrolysis reaction which formed the colloidal silica deposits is reversible, and with the now lower concentration of silica in the nearby phosphoric acid due to the depletion of the silicon nitride, the equilibrium drives the reaction in the
(Continued)

reverse direction, dissolving the deposited silica back into solution.

20 Claims, 5 Drawing Sheets

(51) Int. Cl.
    *H01L 21/4757*     (2006.01)
    *H01L 21/306*     (2006.01)
    *H01L 21/67*     (2006.01)
    *H01L 49/02*     (2006.01)

(52) U.S. Cl.
    CPC .. *H01L 21/02458* (2013.01); *H01L 21/30608* (2013.01); *H01L 21/47573* (2013.01); *H01L 21/6708* (2013.01); *H01L 21/67253* (2013.01); *H01L 28/00* (2013.01)

(56) References Cited

U.S. PATENT DOCUMENTS

| | | | |
|---|---|---|---|
| 6,391,213 | B1 | 5/2002 | Homola |
| 7,367,870 | B2 | 5/2008 | Kurata et al. |
| 7,635,397 | B2 * | 12/2009 | Okuchi ............ H01L 21/67086 29/25.01 |
| 8,685,272 | B2 | 4/2014 | Kim et al. |
| 8,727,002 | B2 | 5/2014 | Reyes |
| 2008/0064223 | A1 * | 3/2008 | Eguchi .................. C09K 13/04 438/757 |
| 2008/0170931 | A1 | 7/2008 | Hashimoto |
| 2010/0035436 | A1 | 2/2010 | Kim et al. |
| 2011/0259376 | A1 | 10/2011 | Wagener et al. |
| 2012/0058629 | A1 | 3/2012 | You et al. |
| 2012/0161068 | A1 | 6/2012 | Greene et al. |
| 2012/0247505 | A1 | 10/2012 | Brown et al. |
| 2012/0289056 | A1 | 11/2012 | Bergman et al. |
| 2012/0322263 | A1 | 12/2012 | Lee et al. |
| 2013/0005219 | A1 | 1/2013 | Takemura et al. |
| 2014/0080310 | A1 | 3/2014 | Chen et al. |
| 2014/0273373 | A1 * | 9/2014 | Makala ............ H01L 27/11582 438/270 |
| 2014/0374023 | A1 | 12/2014 | Kosub |
| 2015/0024989 | A1 | 1/2015 | Chhabra et al. |
| 2015/0371869 | A1 | 12/2015 | Surla et al. |
| 2015/0380423 | A1 | 12/2015 | Kanakamedala et al. |
| 2016/0108284 | A1 | 4/2016 | Yoshizaki |

FOREIGN PATENT DOCUMENTS

| | | |
|---|---|---|
| TW | 576865 B | 2/2004 |
| TW | 201009051 A | 3/2010 |
| TW | 201246354 A | 11/2012 |
| TW | 201541510 A | 11/2015 |
| WO | 2010005889 A1 | 1/2010 |
| WO | 2010135039 A1 | 11/2010 |
| WO | 2012059714 | 5/2012 |
| WO | 2013148911 A1 | 10/2013 |

OTHER PUBLICATIONS

Microtech Systems, Inc., "Phosphoric Acid Nitride Removal", 2007, 9 pgs.
Machine Translation of JP Patent Publication H06-349808, 15 pp.
Taiwan Intellectual Property Office, First Office Action issued in related Taiwan Application No. 106110416 dated Jan. 15, 2018, 19 pp.
U.S. Patent and Trademark Office, Non-final Office Action issued in U.S. Appl. No. 15/467,939 dated Dec. 6, 2017, 24 pp.
Taiwan Intellectual Property Office, Notification of Examination Opinions issued in related TW Patent Application No. 106110416 dated Oct. 1, 2018, 9 pgs., including partial English translation.
Chang Chien, Ying-Hsueh et al., "A Design for Selective Wet Etching of Si3N4/SiO2 in Phosphoric Acid Using a Single Wafer Processor", Journal of The Electrochemical Society, 2018, vol. 165(4), pp. H3187-H3191.
International Searching Authority, International Search Report and Written Opinion issued in related International Application No. PCT/US2017/024123 dated Jul. 4, 2017, 16 pp.
International Searching Authority, International Search Report and Written Opinion issued in counterpart International Application No. PCT/US2017/024128 dated Jul. 4, 2017, 9 pp.
Seo, Dongwan et al., Selective Wet Etching of Si3N4/SiO2 in Phosphoric Acid with the Addition of Fluoride and Silicic Compounds, Microelectronic Engineering, 2014, vol. 118, pp. 66-71.
Taiwan Intellectual Property Office, Notice of Examination Opinions issued in related TW Patent Application No. 106110443 dated May 16, 2018, 19 pp, including English translation.
U.S. Patent and Trademark Office, final Office Action issued in U.S. Appl. No. 15/467,939 dated Jul. 18, 2018, 25 pages.
U.S. Patent and Trademark Office, non-final Office Action issued in U.S. Appl. No. 15/467,939 dated Dec. 31, 2018, 20 pages.

* cited by examiner

PROCESS AND APPARATUS FOR PROCESSING A NITRIDE STRUCTURE WITHOUT SILICA DEPOSITION

This application claims priority to Provisional Patent Application No. 62/315,559, filed Mar. 30, 2016; the disclosure of which is expressly incorporated herein, in its entirety, by reference. This application also incorporates by reference, in its entirety, concurrently filed U.S. patent application Ser. No. 15/467,939, entitled Colloidal Silica Growth Inhibitor and Associated Method and System, by Rotondaro et al., which claims priority to Provisional Patent Application No. 62/315,632, filed Mar. 30, 2016.

BACKGROUND

The present disclosure relates to the processing of silicon wafers in phosphoric acid solutions. In particular, it provides a novel method to prevent the growth of colloidal silica deposits on the wafer surface during processing in phosphoric acid.

Phosphoric acid has been used in the semiconductor industry to remove silicon nitride films with high selectivity to silicon dioxide and pure silicon. In 1967, Gelder and Hauser published an article where they proposed the use of boiling phosphoric acid to remove silicon nitride films. They used the boiling point of the acid at a given dilution to control the acid temperature and its concentration in the process tank. This process has been widely adopted in the semiconductor industry and it is used in production today.

A typical application of the boiling phosphoric acid process in the semiconductor industry is the removal of silicon nitride films. In such applications, the silicon nitride film typically sits on a silicon dioxide film and it is surrounded by deposited silicon dioxide. The process for the removal of the silicon nitride film begins by a careful removal of any remaining silicon dioxide that might rests on top of the silicon nitride film by a diluted hydrofluoric acid (HF) treatment. The dilution of the HF is tailored to remove any remaining silicon dioxide from the surface of the silicon nitride without significantly removing the deposited silicon dioxide that was placed between the silicon nitride regions. After the silicon nitride deglaze step in HF, a high selectivity etch is performed in boiling phosphoric acid to remove the silicon nitride film without removing the deposited silicon dioxide film that exists between the silicon nitride films, stopping on the silicon dioxide film that lays under the silicon nitride film.

It has been found that during processing of certain semiconductor structures the adverse growth of colloidal silica deposits on the exposed silicon dioxide regions may hinder silicon nitride removal and/or other subsequent process steps. There is a need for a method to remove the colloidal silica deposition during the treatment of surfaces in phosphoric acid.

SUMMARY

Described herein is an innovative method to remove the growth of colloidal silica deposits on surfaces treated in phosphoric acid. The disclosed techniques include the use of a high selectivity overetch step in the phosphoric acid process to remove the deposited colloidal silica.

In one embodiment, the disclosed techniques include the use of phosphoric acid to remove silicon nitride from structures having silicon nitride formed in narrow gap or trench structures having high aspect ratios. The arrangement of such structures is particularly conducive to the formation of a detrimental amount of colloidal silica deposits on a surface of the narrow gap or trench through a hydrolysis reaction. When the silicon nitride etching is completed, instead of removing the structure from the phosphoric acid solution, it is left in the solution where an additional chemical reaction now takes place. The hydrolysis reaction which formed the colloidal silica deposits is reversible, and with the now lower concentration of silica in the nearby phosphoric acid due to the depletion of the silicon nitride, the equilibrium drives the reaction in the reverse direction, dissolving the deposited silica back into solution.

In another embodiment, a method for etching features formed on a substrate is provided. The method may comprise providing a substrate having a high aspect ratio structure comprised of a first set of exposed features comprising silicon nitride, and a second set of exposed features comprising silicon or silicon oxide. The method further comprises loading the substrate into a wet chemical processing system. The method further comprises two etch steps: performing a first etch step comprised of exposing the substrate to a first wet etch chemical composition to remove at least part of the silicon nitride from the high aspect ratio structure, the exposing the substrate to a first wet etch chemical composition forming silicon containing deposits on the silicon or silicon oxide of the high aspect ratio structure; and performing a second etch step comprised of exposing the substrate to a second wet etch chemical composition to remove at least some of the silicon containing deposits formed on the silicon or silicon oxide during the first etch step.

In yet another embodiment, a wet chemical processing system is provided. The wet chemical processing system may comprise a chamber configured to receive a substrate and expose the substrate to a wet etch chemical composition, a chemical supply system coupled to the chamber, the chemical supply system supplying the wet etch chemical composition to the chamber, and a controller configured to control components of the wet chemical processing system to execute the techniques described herein.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

It has been found that during phosphoric acid etching of silicon nitride of certain semiconductor structures the adverse growth of colloidal silica depositing on exposed silicon dioxide regions may hinder silicon nitride removal during processing. More specifically, silicon nitride formed in structures having narrow gaps, narrow trenches, and/or high aspect ratios are particularly problematic. Such structures may be found in a wide variety of semiconductor structures such as logic devices, interconnect structures, Fin Field Effect Transistors (FinFET), 3D semiconductor structures, flash memory devices such as Not AND (NAND) logic type memory devices, etc.

As described herein, removal of the silicon containing deposits, such as colloidal silica deposited on surfaces treated in phosphoric acid is provided. The disclosed techniques include the use of a high selectivity overetch step in the phosphoric acid process to remove the deposited colloidal silica. In one embodiment, the disclosed techniques include the use of phosphoric acid to remove silicon nitride from structures having silicon nitride formed in narrow gap or trench structures having high aspect ratios. As discussed, the arrangement of such structures is particularly conducive to the formation of a detrimental amount of colloidal silica deposits on a surface of the narrow gap or trench through a hydrolysis reaction. When the silicon nitride etching is completed, instead of removing the structure from the phosphoric acid solution, it is left in the solution where an additional chemical reaction now takes place. The hydrolysis reaction which formed the colloidal silica deposits is reversible, and with the now lower concentration of silica in the nearby phosphoric acid due to the depletion of the silicon nitride, the equilibrium drives the reaction in the reverse direction, dissolving the deposited silica back into solution.

In a phosphoric acid silicon nitride etch, the high selectivity between the silicon nitride and silicon dioxide etch rates is modulated, at least in part, by the silicon content in the phosphoric acid solution. The higher the silicon content the lower the silicon dioxide etch rate. Since the silicon nitride is little affected by the silicon content, the selectivity between silicon nitride and silicon dioxide etch increases as the silicon content of the solution increases. However, the increase in the silicon content of the solution results in the growth of colloidal silica deposits on the exposed silicon dioxide regions during process. The growth of colloidal silica deposits has a negative impact for the etch of complex structures, as the colloidal silica deposits can prevent the solution flow into high aspect ratio trenches, significantly slowing the nitride etch process. Furthermore, the growth of colloidal silica deposits may have adverse effects on subsequent processing steps.

In one embodiment, the overetch process is done as follows: the structure containing silicon dioxide and silicon nitride is immersed in a bath of phosphoric acid, generally at 70 wt % to 95 wt % phosphoric acid (remainder water), more preferably at 85 wt % phosphoric acid, at a temperature of 140° C. to 170° C., and more preferably 160° C. In the phosphoric acid, the silicon nitride is etched away according to the following chemical reaction:

SiN(s)+H3PO4+H2O→Si(OH)4+NH4H2PO4

This reaction creates silica (Si(OH)4) in the acid solution, but due to the high concentration of silica and the low pH, the silica can react with itself in a hydrolysis reaction to polymerize and form colloidal silica:

—Si—OH+HO—Si—→—Si—O—Si—+H2O

This colloidal silica is able to form colloidal particles in the acid solution or directly on the silicon dioxide surface. Colloidal particles that form in the solution also can aggregate on the silicon dioxide surface. This results in the formation of a silica gel that covers the silicon dioxide surface and continues to grow so long as there is a local high concentration of silica due to the nearby etching of silicon nitride.

When the silicon nitride is completely etched away, instead of removing the structure from the phosphoric acid solution, it is left in the solution where an additional chemical reaction now takes place. The previously shown hydrolysis reaction is reversible, and with the now lower concentration of silica in the nearby phosphoric acid due to the depletion of the silicon nitride, the equilibrium drives the reaction in the reverse direction, dissolving the deposited silica back into solution.

Although the deposited silica is silicon dioxide (SiO2) which is identical to the original silicon dioxide structure that it is forming on, the differences in the oxide may exist. The main difference may be that the original silicon dioxide is a dense crystalline silicon dioxide while the deposited silica is very loose and amorphous, causing them to have very different etch rates. The selectivity of the silicon nitride versus silicon dioxide etch rates may be carefully controlled so that the deposited silica film can be etched away but there is no significant etching of the original silicon dioxide itself.

Once the deposited silica film is dissolved back into the acid solution, then the structure may be removed from the acid bath for subsequent processing steps. The addition of a controlled overetch step is thus provided to remove the deposited colloidal silica from surface treated in phosphoric acid. Instead of removing the unwanted silica film using a different chemical process, the structures stay in the same acid bath to remove the deposits in the same bath due to the reversing of the chemical reaction that caused the deposition in the first place. In such an approach, a first etch step comprised of exposing the substrate to a first wet etch chemical composition to remove at least part of the silicon nitride from the high aspect ratio structure is used. The exposing the substrate to a first wet etch chemical composition forms silica deposits on the silicon or silicon oxide of the high aspect ratio structure. Then a second etch step exposing the substrate to a second wet etch chemical composition to remove at least some of the silica deposits formed on the silicon or silicon oxide during the first etch step is performed. Both the first wet etch chemical composition and the second wet etch chemical composition may comprise phosphoric acid, in fact being the same phosphoric acid bath. However, other techniques may utilize the concepts described herein wherein the first and second wet etch chemical compositions are differing.

Figure 1A:
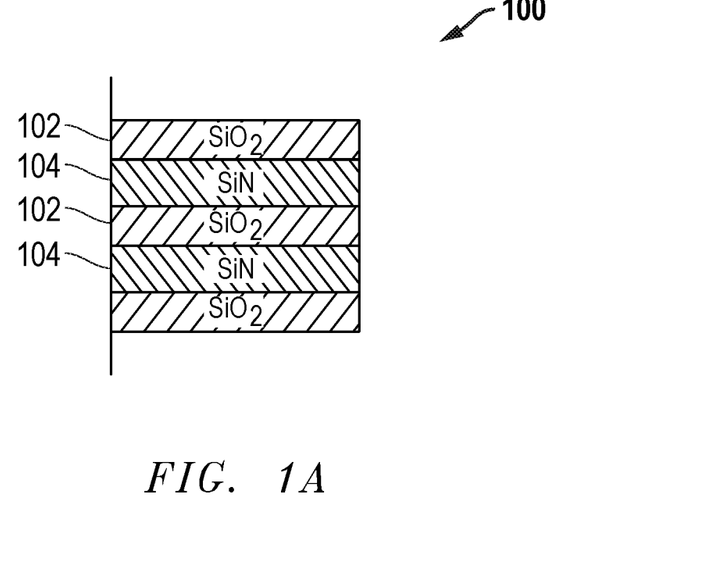
FIGS. 1A-1E illustrate cross-section views of an exemplary semiconductor structure having silicon nitride to be removed and the formation and removal of silica deposits on the semiconductor structure.

As described above, the techniques disclosed herein may be applicable to a wide variety of semiconductor structures such as logic devices, interconnect structures, FinFETs, 3D semiconductor structures, NAND flash memory devices, etc. An exemplary structure is shown in FIG. 1A. Such a structure may exist in a 3D NAND device or any of many other semiconductor devices. It will be recognized that the narrow gap, high aspect ratio structure of FIG. 1A is merely exemplary and those skilled in the art will understand that the techniques described herein may be useful for the processing of many other structures in which the adverse formation of colloidal silica deposits occurs. Thus the narrow gap, high aspect ratio structure shown in FIG. 1A is merely exemplary of any of a wide variety of narrow and/or high aspect ratio structures. For example, the techniques described herein are relevant to high aspect ratio trench structures.

Figure 1B:
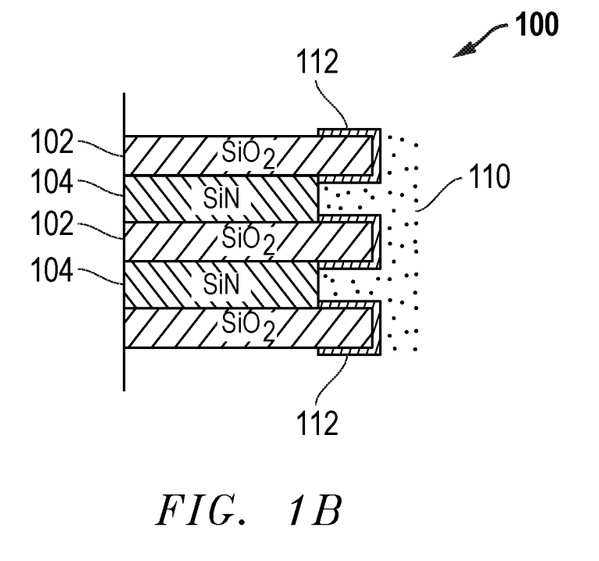
Figure 1C:
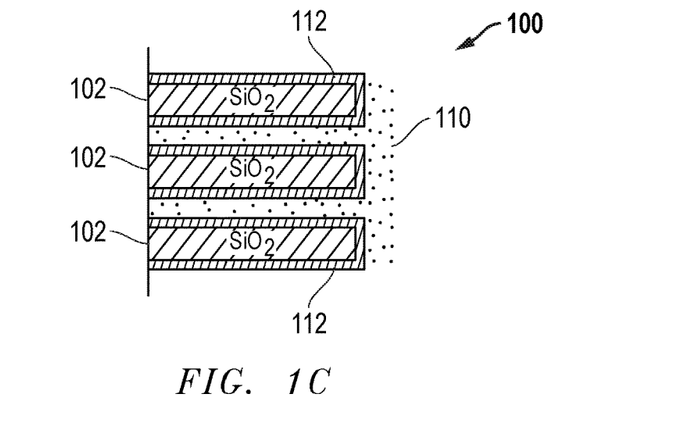
Figure 1D:
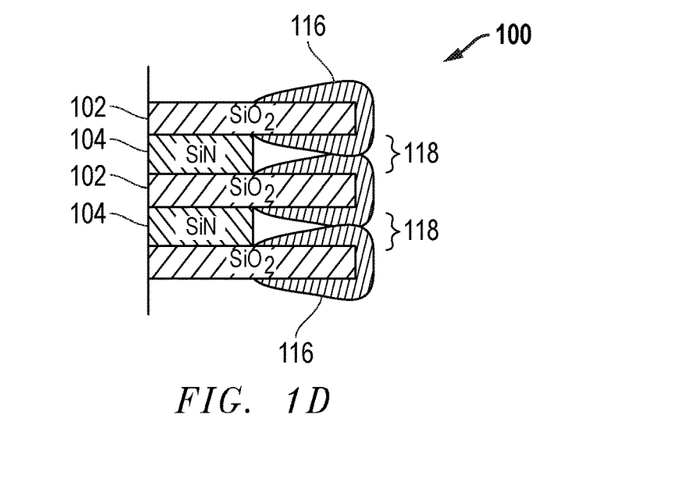

As shown in FIG. 1A, an exemplary semiconductor structure 100, which may be for example a portion of a 3D NAND structure, is shown having silicon nitride formed in narrow, high aspect ratio, gaps. As shown narrow, high aspect ratio, gaps are formed between silicon dioxide (SiO2) layers 102. SiO2 layers 102 may alternatively be Si layers or other oxide layers. Silicon nitride (SiN) layers 104 are formed in the gaps between the SiO2 layers. Etching of the SiN layers may then occur by exposing the semiconductor structure 100 to hot phosphoric acid solution, such as for example be immersion in a hot phosphoric bath or exposing the structure to a spray of hot phosphoric acid. Due to the etching of the SiN, there is a high concentration of colloidal silica (Si(OH)4) 110 dispersed in the phosphoric acid solution near the surface of the SiO2 as shown in FIG. 1B. As shown in FIG. 1B, as the SiN etching occurs, the Si(OH)4 concentration increases and colloidal silica 110 deposits to form silica deposits 112 on the SiO2 surfaces as shown in FIG. 1B. FIG. 1C illustrates the structure 100 when the SiN layer 104 is completely removed. As can be seen in the figure, silica deposits 112 are provide on the SiO2 layers 102. It is noted that in FIG. 1C, relatively uniform silica deposits are provided. However, in practice, the deposits may build up over time at the entrances to narrow gaps or trenches. Thus, as shown in FIG. 1D, the deposits may actually "pinch off" the gaps or trenches, significantly impacting the effectiveness of the ability of the phosphoric acid to etch the remaining silicon nitride. Thus, as shown in FIG. 1D silica deposits 116 may completely close off the gap region 118 formed between SiO2 layers 102, preventing the complete etch of SiN layers 104.

Figure 1E:
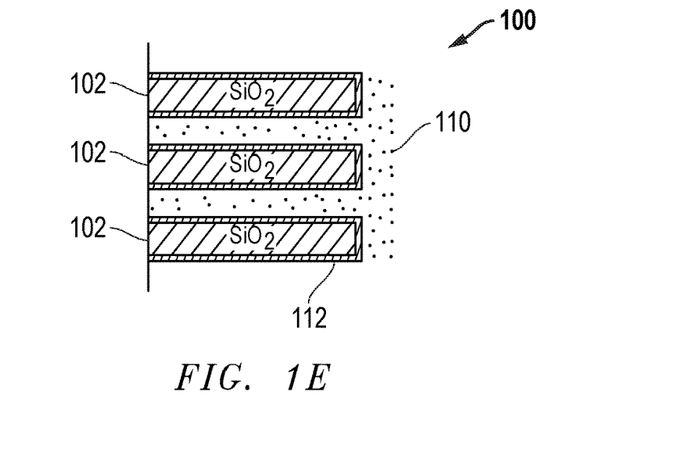

When the etching of the SiN in the first step of etching ends, the increase in the concentration of colloidal Si(OH)4 (silica) in the solution decreases and the silica deposition ends. As described herein, the semiconductor structure 100 continues to be exposed to the phosphoric acid so as to move into second stage of etching. In this second etching step, the deposited silica is etched by the phosphoric acid. As described above, due to the nature of the silica deposits, the deposited silica etches preferentially to the SiO2 layers 102. Thus, as described above, the deposited silica can react in a hydrolysis reaction to polymerize and form colloidal silica that dissolves back into the acid solution. Thus, as shown in FIG. 1E, the continued exposure of the deposited silica to the phosphoric acid solution dissociates and dissolves the deposited SiO2 so that the deposited silica (silica 112 and 116) is removed. Once the deposited silica is dissolved back into the acid solution, the semiconductor structure may be removed from the acid solution for subsequent processing steps.

Figure 2:
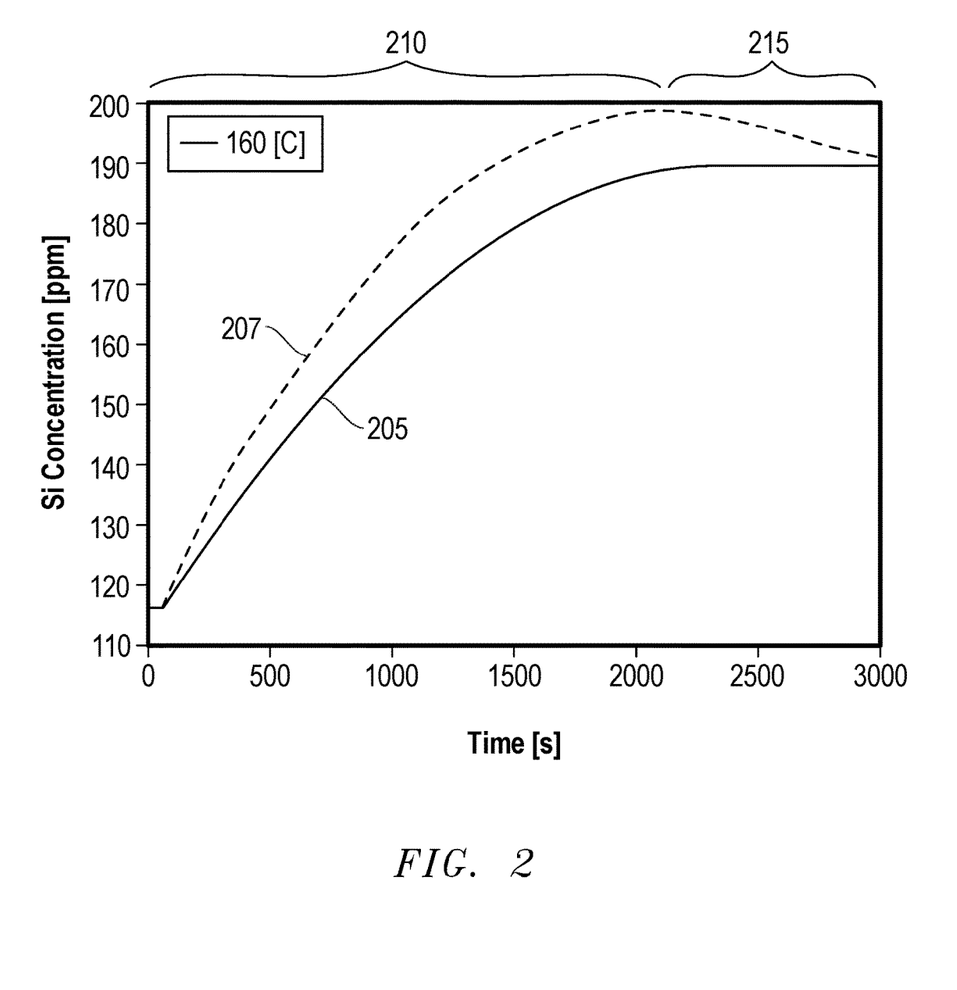
FIG. 2 illustrates an exemplary Si concentration verse time curve illustrating the changing Si concentration during the time period of silicon nitride etching and during the time period of silica deposit removal.

The process described above is shown in an exemplary Si concentration verse time chart of FIG. 2. As shown in FIG. 2, the Si concentration is provided for a silicon nitride etching process of a structure such as shown in FIG. 1A immersed in a bath of phosphoric acid, generally at 85 wt % phosphoric acid (remainder water) at 160° C. As shown in FIG. 2, the bulk silicon concentration (ppm) curve 205 generally increases over time. This reflects the bulk concentration of silicon generally in the phosphoric acid solution. More particularly, the silicon concentration increase over time period 210 which generally corresponds to the period during which SiN is being etched. The time period 215 corresponds to the period in which the SiN etching no longer occurs. During time period 215, the silica deposits are being removed from the semiconductor structure such as shown in FIG. 1E. Silicon concentration curve 207 illustrates the local silicon concentration in the vicinity of the high aspect ratio structure (as opposed to the bulk concentration in the solution generally as shown by curve 205). As shown, locally inside the high aspect ratio structure the silicon concentration rises faster due to the local silica flux from the silicon nitride etch. As shown, the local silicon concentration will ultimately reach a higher value than the bulk silicon concentration in the phosphoric acid solution. However, once the silicon nitride etch is finished, the local silicon concentration in the high aspect ratio structure region shown in curve 207 starts to decline and eventually will reach the bulk silicon concentration value over time as shown in the figure.

As mentioned above, the higher the silicon content is, the lower the silicon dioxide etch rate that generally results. Further, the silicon nitride etch rate is little affected by the silicon content. Thus, the silicon content changes shown in FIG. 2 will result in a selectivity change over time for the etch selectivity between silicon nitride and silicon dioxide etch. Thus, as shown by curve 207 in FIG. 2, the local etch selectivity increases as the silicon content of the solution increases to a maximum at approximately the end of time range 210 at which point a maximum silicon nitride to silicon oxide etch selectivity will be obtained. As the local concentration drops in time range 215, the local selectivity between silicon nitride and silicon oxide will correspondingly drop from the maximum selectivity. Thus, there is provided a technique in which a first and second etch step is provided. The first etch step may correspond to the time range 210 and the second etch step may correspond to the time range 215. The first etch step has a silicon nitride to silicon oxide maximum etch selectivity that is greater than the silicon nitride to silicon oxide etch during at least portions of the second etch step. In one embodiment, the localized etch selectivity for silicon nitride to silicon dioxide etch rates during the first etch step may be greater than 100:1, in some cases greater than 300:1 and in some cases greater than 500:1. The localized etch selectivity for silicon nitride to silicon dioxide etch rates during the second etch step will be equal or less than the first etch step with selectivity decreasing over time to 10% lower than the first etch step maximum selectivity in some embodiments, 30% lower than the first etch step maximum selectivity in some embodiments and even 50% lower than the first etch step maximum selectivity in some embodiments.

The various chemical constituents in the acid solution may be monitored so as to monitor the progress of the reaction equations described above. Thus, monitoring the concentration of at least one chemical constituent of the first wet etch chemical composition (the composition while silicon nitride is being etched) using a chemical monitoring system included in a wet chemical processing system may be performed. Further, monitoring the concentration of at least one chemical constituent of the second wet etch chemical composition (the composition while silica deposits are being removed) using a chemical monitoring system included in a wet chemical processing system may be performed. For example, the monitoring of the first and second etch steps may be a monitoring of the silicon concentration shown in FIG. 2. As mentioned, though, monitoring of other chemical constituents may be performed.

It will be recognized that the amount of additional time that the semiconductor structure is exposed to the phosphoric acid solution after the removal of the SiN will vary depending upon numerous process variables, the structure being etched, the amount of exposed silicon nitride removed, the amount of silica deposits and the various etch process variables (acid concentrations, silicon concentrations, temperature, etc.). Thus, it will be recognized that the times shown in FIG. 2 are merely exemplary. In one embodiment, the additional etching time for removal of the silica deposits may be in the range of an approximately 5%-40% overetch time (as a function of the silicon nitride etch time), and more preferable in the range of a 15%-30% overetch time.

As described in relation to FIGS. 1B-1D, the techniques described herein are particularly useful for high aspect ratio structures. Thus, layered structures having high aspect ratios such as shown in FIGS. 1B-1D, high aspect trench structures, high aspect interconnect structures, etc. would benefit from these techniques. Such high aspect ratio structures will result in higher concentrations of colloidal silica near the surface of the structure as the colloidal silica will not diffuse as quickly into the bulk of the acid solution. Thus, the mechanism may occur such as shown n FIG. 1D in which the buildup of deposited silica may substantially narrow the desired gap spacing. As described herein high aspect ratios are considered to be aspect ratios of at least 4:1 or greater.

Figure 3:
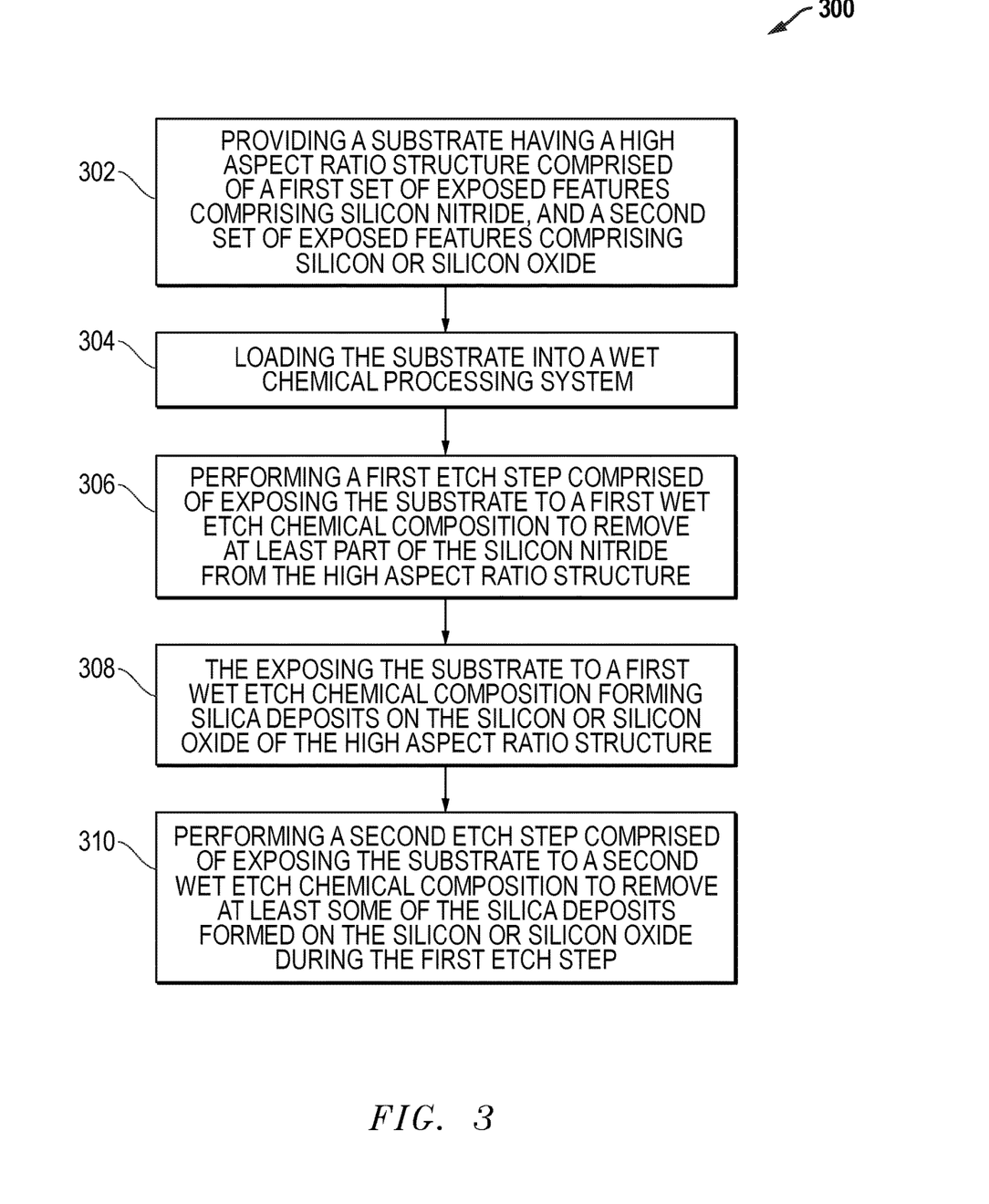
FIG. 3 illustrates an exemplary process flow for one embodiment of the silica deposit removal techniques disclosed herein.

The present disclosure provides techniques for performing a silicon nitride etch in a wet chemical processing system. FIG. 3 provides an illustrative process flow 300 for such techniques. It will be recognized that the techniques described herein may be advantageously utilized in other process flows. As shown in FIG. 3, step 302 includes providing a substrate having a high aspect ratio structure comprised of a first set of exposed features comprising silicon nitride, and a second set of exposed features comprising silicon or silicon oxide. Step 304 includes loading the substrate into a wet chemical processing system. Step 306 includes performing a first etch step comprised of exposing the substrate to a first wet etch chemical composition to remove at least part of the silicon nitride from the high aspect ratio structure. Step 308 describes that the exposing the substrate to a first wet etch chemical composition forms silica deposits on the silicon or silicon oxide of the high aspect ratio structure. Step 310 includes performing a second etch step comprised of exposing the substrate to a second wet etch chemical composition to remove at least some of the silica deposits formed on the silicon or silicon oxide during the first etch step.

As discussed above, in step 306 and step 310 the first wet etch chemical composition and/or the second wet etch chemical composition may comprises phosphoric acid. Thus, the first and second wet etch chemical composition may be the same or different. In one embodiment, the two wet etch chemical compositions are the same, the second wet etch chemical composition being part of a silicon nitride overetch step.

Various process parameters, singularly or in combination may be selected wherein at least one parameter of the first etch step or the second etch step is selected such that substantially all of the silicon containing deposits formed on the exposed features comprising silicon or silicon dioxide during the first etch step are removed during the second etch step. The at least one parameter may be selected from the group comprised of duration of the first etch step, duration of the second etch step, concentration of at least one chemical constituent of the first wet etch chemical composition, concentration of at least one chemical constituent of the second wet etch chemical composition, temperature of the first wet etch chemical composition, temperature of the second wet etch chemical composition, flow rate of the first wet etch chemical composition, and flow rate of the second wet etch chemical composition. In this manner, the process conditions and variables may be selected to provide the desired effect of removal of all of the silicon containing deposits.

As mentioned above, the techniques provided herein may be utilized in any of a wide range of silicon nitride etching equipment and chemistries. Thus, the techniques to described herein may be utilized in multi-wafer batch silicon nitride etch systems or single wafer silicon nitride systems. For example, the systems described in more detail in concurrently filed U.S. patent application Ser. No. 15/467,939, entitled Colloidal Silica Growth Inhibitor and Associated Method and System, by Rotondaro et al., the disclosure of which is expressly incorporated herein in its entirety by reference, may be utilized. However, it will be recognized that other systems may also advantageously utilize the techniques provided herein. Further, the techniques described herein also are not limited to phosphoric acid chemistries but are also applicable to other etch chemistries. In addition, even for the use of a phosphoric acid chemistry, the techniques are not limited to the phosphoric acid with water chemistries and process variables described herein. For example, a phosphoric acid solution that also includes the use of additives, inhibitors and/or sulfuric acid and may include a range of temperature, concentration and other process variables may be utilized, as described in more detail in concurrently filed U.S. patent application Ser. No. 15/467,939, entitled Colloidal Silica Growth Inhibitor and Associated Method and System, by Rotondaro et al., the disclosure of which is expressly incorporated herein in its entirety by reference. Further, though described herein in a system in which the silicon nitride etch and the deposited silica removal steps are performed in the same phosphoric acid solution, it will be recognized that the two steps may be accomplished with differing wet etch compositions. Thus the silicon nitride etch composition and the silica removal etch composition may be the same wet etch composition or may be differing wet etch compositions. It will be therefore recognized that the techniques described herein for the removal of deposited silica in a silicon nitride etch system are applicable to a wide range of etching systems and etching chemistries.

In one embodiment, the methods described herein may be accomplished in a wet chemical processing system. The wet chemical processing system may comprise a chamber configured to receive a substrate and expose the substrate to a wet etch chemical composition and a chemical supply system coupled to the chamber for supplying the wet etch chemical composition to the chamber. The wet chemical processing system may further comprise a controller configured to control components of the wet chemical processing system to execute the methods disclosed herein. The wet chemical processing system may also comprise a chemical monitoring system for monitoring the concentration of at least one chemical constituent of the wet etch chemical composition. The chemical constituent monitored, in one embodiment may be selected from the group consisted of silicon, silica, and a Si-containing compound. The wet chemical processing system may be a single substrate processing system or configured to process a plurality of substrates at the same time.

Figure 4:
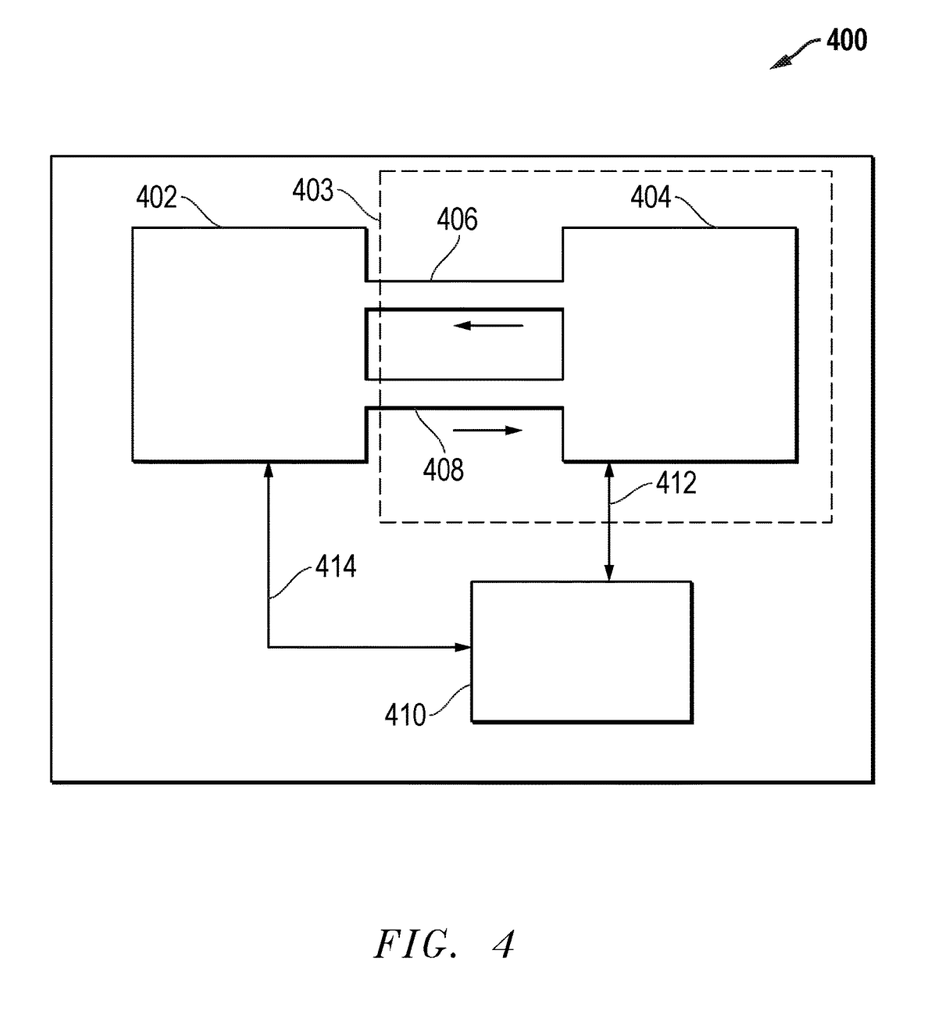
FIG. 4 illustrates a wet chemical processing system which may be used to perform the techniques described herein.

FIG. 4 illustrates one exemplary wet chemical processing system 400. It will be recognized that the techniques described herein may be utilized with a wide variety of other wet chemical processing systems. A chamber 402 is provided. The chamber is configured to receive a substrate and expose the substrate to a wet etch chemical composition. The chamber may be a single wafer chamber or may be a chamber for process multiple wafers such as a batch wet etch tank. A chemical supply system 403 may comprise a wet chemical source 404 and recirculation lines 406 and 408 which provide wet chemicals to and from the chamber. A controller 410 is coupled to the chamber and the chemical supply system to control and/or receive feedback from the various components of the wet chemical processing system 400 via signal lines 412 and 414. In one exemplary embodiment, the controller 410 may be a processor, microcontroller, or programmable logic device in combination with other circuitry such as memory, I/O ports, etc. In one embodiment, the processor, microcontroller or programmable logic device may be configured to execute instructions or configuration files to perform the functions described herein.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for etching features formed on a substrate, comprising:
   providing a substrate having a high aspect ratio structure comprised of a first set of exposed features comprising silicon nitride, and a second set of exposed features comprising silicon or silicon oxide;
   loading the substrate into a wet chemical processing system;
   performing a first etch step comprised of exposing the substrate to a wet etch solution of phosphoric acid to selectively remove at least part of the silicon nitride from the high aspect ratio structure, wherein a hydrolysis reaction creates a silica reaction product in the first wet etch solution from the silicon nitride, wherein at least a portion of the silica reaction product deposits on the silicon or silicon oxide of the high aspect ratio structure; and
   performing a second etch step comprised of further exposing the substrate to the wet etch solution of phosphoric acid to remove at least some of the deposited silica reaction product from the silicon or silicon oxide by dissolving the deposited silica reaction product back into the wet etch solution of phosphoric acid,
   wherein the first etch step is performed until a concentration of silica reaction product in the wet etch solution of phosphoric acid decreases due to depletion of the silicon nitride available for the hydrolysis reaction, and wherein the second etch step is performed continuously after performing the first etch step by continuously exposing the substrate to the wet etch solution of phosphoric acid and uses the decreased concentration of silica reaction product in the wet etch solution to reverse the hydrolysis reaction and dissolve the deposited silica reaction product back into the wet etch solution of phosphoric acid.

2. The method of claim 1, wherein the second etch step is a silicon nitride overetch step.

3. The method of claim 2, wherein the second etch step is an overetch step in a range of approximately 5%-40%.

4. The method of claim 3, wherein the second etch step is an overetch step in a range of approximately 15%-30%.

5. The method of claim 1, further comprising:
   monitoring a concentration of at least one chemical constituent of the wet etch solution during the first etch step using a chemical monitoring system included in the wet chemical processing system.

6. The method of claim 1, further comprising:
   monitoring a concentration of at least one chemical constituent of the wet etch solution during the second etch step using a chemical monitoring system included in the wet chemical processing system.

7. The method of claim 1, wherein at least one parameter of the first etch step or the second etch step is selected such that substantially all of the deposited silica reaction product formed on exposed features comprising silicon or silicon dioxide during the first etch step is removed during the second etch step.

8. The method of claim 7, wherein the at least one parameter is selected from a group consisting of duration of the first etch step, duration of the second etch step, concentration of at least one chemical constituent of the wet etch solution during the first etch step, concentration of at least one chemical constituent of the wet etch solution during the second etch step, temperature of the wet etch solution during the first etch step, temperature of the wet etch solution during the second etch step, flow rate of the wet etch solution during the first etch step, and flow rate of the wet etch solution during the second etch step.

9. The method of claim 1, wherein the wet chemical processing system is a single substrate processing system.

10. The method of claim 1, where in the wet chemical processing system is configured to process a plurality of substrates at the same time.

11. The method of claim 1 wherein a maximum silicon nitride to silicon oxide etch selectivity during the first etch step is higher than the silicon nitride to silicon oxide etch selectivity during at least a portion of the second etch step.

12. The method of claim 1, further comprising:
    monitoring a concentration of silica, silicon or a silicon-containing compound in the wet etch solution during the first and second etch steps using a chemical monitoring system included in the wet chemical processing system.

13. The method of claim 1 wherein the wet etch solution of phosphoric acid is at a temperature of 140° C. to 170° C. when the first and second wet etch steps are performed.

14. The method of claim 1 wherein the wet etch solution of phosphoric acid is 70 wt % to 95 wt % phosphoric acid.

15. The method of claim 1 wherein the wet etch solution of phosphoric acid is at a temperature of 140° C. to 170° C. when the first and second wet etch steps are performed and the wet etch solution of phosphoric acid is 70 wt % to 95 wt % phosphoric acid.

16. A method for etching features formed on a substrate, comprising:
    providing a substrate having a high aspect ratio structure with an aspect ratio of at least 4:1 comprised of a first set of exposed features comprising silicon nitride, and a second set of exposed features comprising silicon or silicon oxide;
    loading the substrate into a wet chemical processing system;
    exposing the substrate to a wet etch solution of phosphoric acid to generate a chemical etching reaction for a first time duration to selectively remove at least part of the silicon nitride from the high aspect ratio structure, wherein during the first time duration a concentration of silica in the wet etch solution from the chemical etching reaction initially increases and a hydrolysis reaction occurs that forms a colloidal silica reaction product that deposits on the silicon or silicon oxide of the high aspect ratio structure, and wherein the first time duration ends when the concentration of silica decreases in the wet etch solution due to depletion of silicon nitride available for the chemical etching reaction;

after the first time duration, continuing exposing the substrate to the wet etch solution of phosphoric acid for a second time duration to reverse the hydrolysis reaction thereby dissolving the deposited silica reaction product back into the wet etch solution of phosphoric acid to preferentially remove substantially all of the deposited colloidal silica reaction product from the silicon or silicon oxide without etching the silicon or silicon oxide; and monitoring a concentration of silica, silicon or a silicon-containing compound in the wet etch solution using a chemical monitoring system included in the wet chemical processing system to determine completion of the first and second time durations.

17. The method of claim 16 wherein a maximum silicon nitride to silicon oxide etch selectivity during the first time duration is higher than the silicon nitride to silicon oxide etch selectivity during the second time duration.

18. The method of claim 16 wherein the wet etch solution of phosphoric acid is at a temperature of 140° C. to 170° C. for the first time and second time duration.

19. The method of claim 16 wherein the wet etch solution of phosphoric acid is 70 wt % to 95 wt % phosphoric acid.

20. The method of claim 16 wherein the wet etch solution of phosphoric acid is at a temperature of 140° C. to 170° C. for the first time and second time duration and the wet etch solution of phosphoric acid is 70 wt % to 95 wt % phosphoric acid.

* * * * *